United States Patent [19]

Räbiger

[11] Patent Number: 4,851,783
[45] Date of Patent: Jul. 25, 1989

[54] METHOD OF AND APPARATUS FOR DIGITALLY SETTING A CONTROL FREQUENCY

[75] Inventor: Jürgen Räbiger, Düren, Fed. Rep. of Germany

[73] Assignee: Kernforschungsanlage Julich GmbH, Julich, Fed. Rep. of Germany

[21] Appl. No.: 181,974

[22] Filed: Apr. 15, 1988

[30] Foreign Application Priority Data

Apr. 16, 1987 [DE] Fed. Rep. of Germany ....... 3712975

[51] Int. Cl.$^4$ .......................... H03B 19/00; H03K 5/00
[52] U.S. Cl. ...................................... 328/15; 328/140; 307/271; 377/47; 377/52
[58] Field of Search .................. 328/14, 15, 136, 140; 377/47, 52; 307/271, 529; 331/53

[56] References Cited

U.S. PATENT DOCUMENTS 3,999,049  12/1976  Roche et al. ........................... 328/14
4,075,544   2/1978  Leenhouts ........................... 307/271
4,325,031   4/1982  Ooms et al. ........................... 328/14

FOREIGN PATENT DOCUMENTS 2539692  10/1977  Fed. Rep. of Germany .

Primary Examiner—John S. Heyman
Assistant Examiner—Timothy P. Callahan
Attorney, Agent, or Firm—Herbert Dubno

[57] ABSTRACT

A method of and an apparatus for generating a control frequency in which two submultiples of a frequency standard are obtained which differ by unity in the respective frequency division and are mixed so that the contribution of a prior control frequency is reduced form period group to period group while the contribution of the new control frequency is increased from period group to period group. The system provides fine control of frequencies for, for example, driving synchronous motors without requiring excessively high frequency standard oscillators.

5 Claims, 2 Drawing Sheets

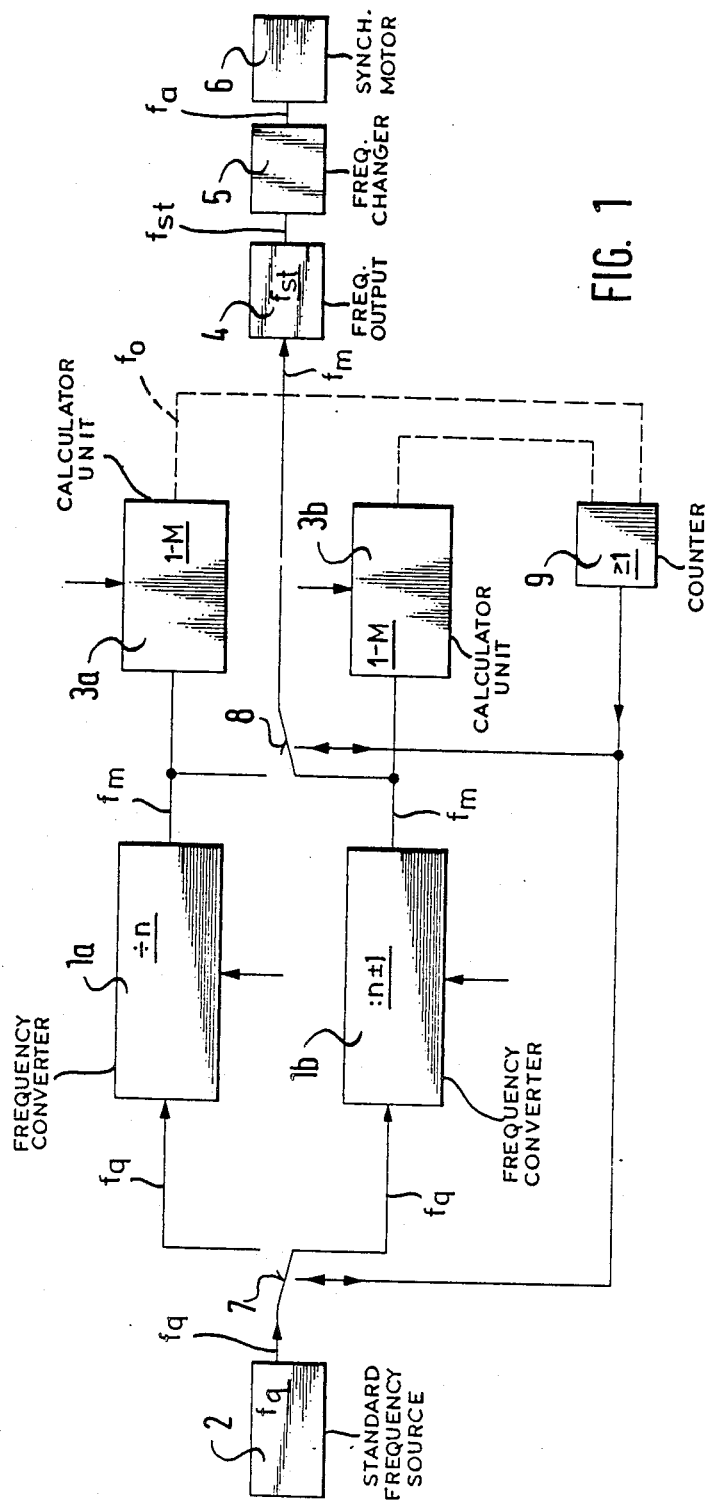

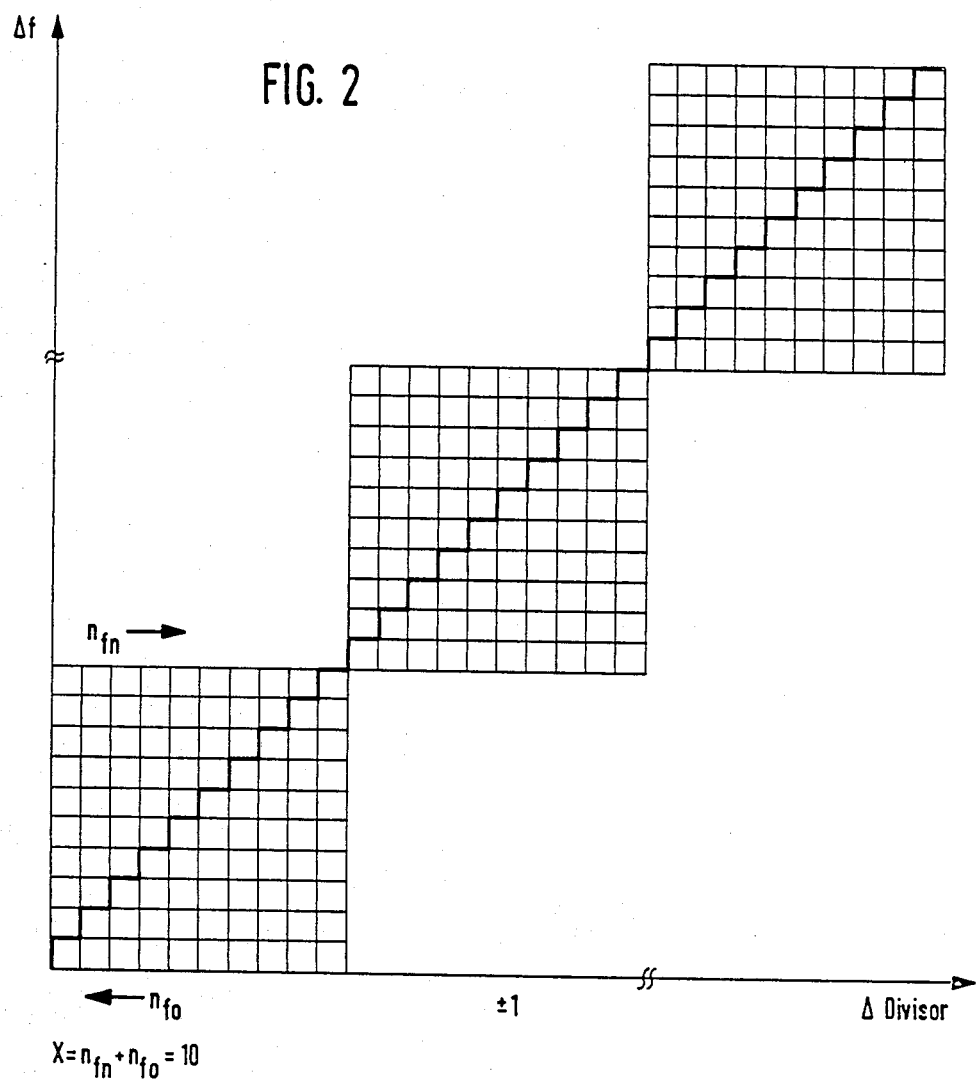

METHOD OF AND APPARATUS FOR DIGITALLY SETTING A CONTROL FREQUENCY

FIELD OF THE INVENTION

My present invention relates to a method of digitally setting a control frequency and to an apparatus for that purpose, e.g. for the generation of a reference frequency for any particular electronic-control function.

BACKGROUND OF THE INVENTION

In order to generate with precision a particular control frequency, systems have been developed which utilize divider-type integrated circuits based upon microprocessor technology and whose limiting frequencies for many applications may not be sufficiently high. Divider ICs use as a frequency standard quartz oscillators with a quartz frequency of 9 MHz.

While such frequencies suffice in many cases, they are not satisfactory in other situations in which a large number of intermediate frequencies must be generated from the quartz oscillator frequency. This is the case, for example, for very fine or precise control of speed-setting in synchronous motor operation.

For example, when the standard frequency of 9 MHz serves as a primary frequency and an integral divisor of 1500 is selected, a variation in the divisor by unity in the digital setting of the divisor can result in a control frequency change jump $\Delta f$ of 4 HZ.

Such a frequency jump in the control of a synchronous motor can result in loss of synchronous characteristics to significant phase-current fluctuations.

The problem can be avoided by the use of a converter to shift the frequency range which is employed in the 100 MHz ultrahigh frequency range by, for example, increasing the frequency standard used as the primary frequency by a power of 10. This however, requires expensive microelectronic modules for frequency transformation.

It is also possible to provide fine-step control of a frequency or a finely selectable control frequency with the aid of a synthesizer. With a synthesizer, it is possible to mix two frequencies which can be obtained by an integral deviation of a frequency standard to generate respective subharmonics or submultiples of the frequency standard. The mixing may involve addition or subtraction of the two submultiple frequencies.

Synthesizers of conventional design utilizing these techniques are, however, relatively expensive and to use synthesizers of such cost to generate precisely controllable frequency outputs for the operations of synchronous motors is especially uneconomical because many of the characteristics of the high-quality synthesizer units thereby are unutilized.

It is also not possible with this system to drive a synchronous motor together with other motors of a drive cascade, (for example in a system for feeding a web material in paper manufacture, for driving pressure rolls, or for driving spinning machines) since it is not possible to generate special phase differences as may be required for such systems. For the simultaneous drive of the motors of such cascade, additional devices are required for phase control of the respective motors.

OBJECTS OF THE INVENTION

It is the principal object of the present invention to provide an improved process for digitally generating a control frequency which allows very fine variation in the control frequency (i.e. digital-frequency control in very small space $\Delta f$) while avoiding the use of ultrahigh frequencies.

Another object is to provide an improved apparatus for carrying out this method.

A further object is to obviate drawbacks of earlier systems for generating and controlling a variable frquency with high precision.

SUMMARY OF THE INVENTION

These objects are attained, in accordance with the invention, in a method or process for the digital setting of a control frequency $f_{st}$ which comprises the steps of:
(a) dividing a standard frequency by an integer to form a first control frequency fol as a first submultiple of said standard frequency;
(b) dividing said standard frequency by another integer to form a second control frequency fn as a second submultiple of said standard frequency; and
(c) mixing said first control frequency fo and said second control frequency fn so that within each period group $x_o$ of x periods of a resulting mixed signal constituting an output control frequency $f_{st}$ a fraction of the periods $n_{fo}$ is driven by the control frequency fo while a remaining fraction $n_{fn}$ of the periods is driven with the control frequency fn so that in each period group $x_o$ for the x periods;

$$x = n_{fn} + n_{fo}.$$

Advantageously, the method further comprises the steps of:
inducing a change in the control frequency within a period count of $x^2$;
dividing the $x^2$ periods into period groups $x_1$ to $x_x$ each of x periods so that the period groups $x_1$ to $x_x$ follow one another in succession; and
increasing the fraction of the periods $n_{fn}$ by at least one period and decreasing the fraction of the periods $n_{fo}$ by at least one period from period grout to period group in said succession of $x_1$ to $x_x$ period groups so that after the lapse of $x^2$ periods, all periods have the frequency fn.

Advantageously, the period count $x^2$ is selected as a function of the desired control frquency $f_{st}$.

The period count $x^2$ is selected so that;

$$x^2 = k \cdot f_{st}^3$$

wherein k is a proportionality constant.

The method can also comprise the step of generating said standard frequency by exciting a quartz crystal controlled oscillator.

The apparatus for carrying out the method of the invention can comprise the steps of:
(a) dividing a standard frequency by an integer to form a first control frequency fol as a first submultiple of said standard frequency;
(b) dividing said standard frequency by another integer to form a second control frequency fn as a second submultiple of said standard frequency; and
(c) mixing said first control frequency fo and said second control frequency fn so that within each period group $x_o$ of x periods of a resulting mixed signal constituting an output control frequency $f_{st}$ a fraction of the periods $n_{fo}$ is driven by the control frequency fo while a remaining fraction $n_{fn}$ of the periods is driven with the control frequency fn so that in each period group $x_o$ for the x periods:

$$x = n_{fn} + n_{fo}.$$

From the foregoing, it will be apparent that for the setting of the control frequency, initially two control frequencies $f_o$ and $f_n$ are generated by the division of a standard frequency by respective integers, i.e. as submultiples.

The two control frequencies are then mixed together within successive periods x in the following way:

each of the periods x is subdivided into periods $n_{fo}$ and $n_{fn}$, whereby $x = n_{fo} + n_{fn}$.

During the period $n_{fo}$, the control frequency $f_o$ is supplied while during the period $n_{fn}$, the control frequency $f_n$ is supplied so that over the period x, a mean control frequency $\bar{f}_{st}$ of:

$$\bar{f}_{st} = 1/x \, (n_{fo} \cdot f_o + n_{fn} \cdot f_n)$$

is obtained.

The mean control frequency $\bar{f}_{st}$ is then determined by a corresponding selection of the number of periods $n_{fo}$ and $n_{fn}$ which are used in the mixing step.

The frequencies $f_o$ and $f_n$ are submultiples which differ from one another in that the divisor integers differ by at least one, i.e. the dividers forming these frequencies have divisors differing by at least one and such that:

$$f_o < \bar{f}_{st} < f_n.$$

It will be apparent that the invention therefore allows selection of a control frequency over a wide range but with high precision because of the fine setting which is possible within the range indicated. Any intermediate frequency between $f_o$ and $f_n$ may therefore be obtained with ease.

The process of the invention is therefore most advantageous when a variable control frequency is to be obtained.

It has been found to be advantageous to complete a control frequency change $\Delta f$ within an integral number of periods $x^2$ which can be subdivided into successive period groups, $x_1$ to $x_2$ which can be subdivided into successive period groups, $x_1$ to $x_x$, for example in period groups $x_1, x_2 \ldots x_{10}$. Each period group thus contains x periods of the aforedescribed type, whereby in each period group x a portion of the periods $n_{fo}$ of a prior frequency, for example the starting frequency $f_o$, will appear while the other part of the periods $n_{fn}$ are driven with the new frequency $$f_n(f_n = f_o \pm \Delta f).$$

This means that:

$$x(\text{from } x_1 \text{ to } x_x) = n_{fo} + n_{fn}.$$

The number of periods, respectively, with the new and old frequencies can be so altered from period group to period group that the number of periods $n_{fn}$ with the new frequency increases by at least one period from $x_1$ to $x_x$, while the number of periods $n_{fo}$ with the old or original frequency decreased by at least one period from $x_1$ to $x_x$.

Thus by passing through a period number $x^2$ in each period group $x_1$ to $x_x$ from period group to period group with an increase of the new frequency drive $f_n$ by at least one period and a reduction of the old frequency $f_n$ by at least one period, after each $x^2$ periods, the newly set control frequency, say the frequency $f_n$, will be achieved.

For example, in the control of synchronous motors utilizing the control frequency which is outputted by the system of the invention, within the first period group $x_1$, the motor is energized only for a single period of that group with the new rotary field frequency $f_n$. For all other periods of the period group $x_1$, the original driving frequency $f_o$ applies.

In the next period group, $x_2$, the number of periods $n_{fn}$ with a new frequency $f_n$ is increased by unity (1) so that the synchronous motor is energized for two periods with the new control frequency $f_n$ and for the remainder of the period group $x_2$ by the original frequency $f_o$.

With each further period group x, the number of periods $n_{fn}$ (at which the frequency $f_n$ applies) is increased by 1 so that the lapse of $x^2$ periods the new driving frequency $f_n$ is the exclusive driving frequency for the motor.

The process of the invention, therefore, provides a stepwise approximation to the new frequency $f_n$ by control frequency increments which are changed by a factor x which can correspond in essence to the increase in a standard frequency by corresponding factors x.

According to another feature of the invention, the number of periods $x^2$ is selected in dependence upon the required control frequency. Most advantageously a relationship $x^2 = k \cdot f_{st}^3$ will apply. In this relationship, k is a proportionality factor which depends upon the technological conditions of use. For example, if the control frequency is to be used as a driving frequency for an electric motor, k will be proportional to the output speed. The period count $x^2$ is thus greater as the control frequency $f_{st}$ is greater. It increases with increasing control frequency change $\Delta f$ and a quasilinearization can be obtained by changing the divisor. A change in the standard frequency is not required.

BRIEF DESCRIPTION OF THE DRAWING

The above and other objects, features and advantages of the present invention will become more readily apparent from the following description, reference being made to the accompanying drawing in which:

FIG. 1 is a block diagram of a circuit in accordance with the invention for carrying out the claimed process; and FIG. 2 is a graphic illustration of the change in the control frequency by $\Delta f$.

SPECIFIC DESCRIPTION

FIG. 1 is a block diagram which shows frequency converters 1a and 1b which can be connected to a standard frequency source 2, i.e. a quartz oscillator having a primary frequency $f_q$. The outputs of the frequency converters 1a and 1b can be applied to the calculator units 3a and 3b which are frequency controllers so set that the output from the frequency converters represented at 4 has the control frequency $f_{st}$. In the embodiment illustrated, the output port 4 of the frequency controller is applied to a frequency changer 5 connected to synchronous motors 6.

The frequency converters 1a and 1b are programmable counters or divider integrated circuits and the calculator units can be controlled via a corresponding bus by a central processor unit or CPU, not shown.

From the calculator unit 3a the frequency starting frequency $f_o$ is obtained as a submultiple of the standard frequency $f_q$ and from this starting frequency, a period count x is obtained in accordance with the relationship:

$$x^2 = k \cdot f_{st}^3$$

where $f_{st} = f_o$. The new control frequency which is to be imparted to the motor can be another submultiple of the standard frequency $f_q$ derived by the frequency converter or divider 1b and represented as $f_n$. The frequency $f_n$ is thus set at the frequency converter 1b and is tapped from the calculator unit 3b.

To apply the new control frequency $f_n$ to the output elements 5 and 6, there is applied to the frequency output element 4, in accordance with calculator generated periods within a period count:

$$x = n_{fo} + n_{fn}$$

either the starting frequency $f_o$ or the new control frequency $f_n$.

Thus in each period group $x_1$ to $x_x$ the number of periods $n_{fn}$ with the new frequency $f_n$ will be increased by 1 from period group to period group and the number $n_{fo}$ of the periods with the original frequency $f_o$ will be reduced by 1 from period group to period group.

Switching over between old and new frequencies is effected by ganged electronic switches represented at 7 and 8.

Thus during the interval when the starting frequency $f_o$ is to be tapped, the frequency standard 2 is connected by the switch 7 with the frequency converter 1a and the calculator unit 3a while switch 8 connects the frequency converter 1a with the frequency output element 4.

In FIG. 2 the switch 7 is connected to the frequency converter 1b and via the switch 8, the control frequency is delivered at the frequency output 4. The calculator units 3a and 3b step a count 9 for resetting the switches 7 and 8 at the end of each period group for the increase in the output of one divider and the decrease in the output of the other divider for the next period group as described.

The completion of a frequency change within a period count $x^2$ for a frequency change of $\Delta f$ is seen in FIG. 2.

In the practical embodiment illustrated, the divider ICs are connected to a frequency standard which can be a quartz oscillator or quartz standard with a primary frequency $f_q$ of 9 MHz. The submultiples of the dividers are set so that the starting frequency $f_o$ provides a control frequency $f_{st}$ of 1200 Hz for a drive frequency $f_a$ (following frequency change at 5) at the motor of 100 Hz. For determining the period count $x^2$ within which a complete frequency change is to be effected with an integral alteration of the divisor of 1, a constant $k_a$ is selected where $k_a = 10 \cdot 10^{-5}$. This corresponds to:

$$x^2 = k \cdot f_{st}^3 = k_a \cdot f_a^3 = 100 \text{ for } x = 10.$$

The new control frequency $f_n$ will thus be reached after 100 periods and each period group x will correspond to 10 periods so that for the control frequency change $\Delta f$ 10 period groups are required. Thus, the number of periods carrying the new frequency $f_n$ will increase from the first period group $x_1$ to the last period group $x_{10}$ from $n_{fn} = 1$ to $n_{fn} = 10$, an increment of 1 in each case from period group to period group. Concomitantly the number $n_{fo}$ at which the starting frequency $f_o$ appears decreases in each of the period groups $x_1$ to $x_{10}$ from 9 to 0 in increments of 1 from group to group.

To afford a better understanding of the operation of the switches 7 and 8, the counter 9 and the calculator units 3a, 3b, the following more specific description of the process is provided:

Initially, the starting frequency $f_o$ is ascertained and the value of $x^2$ is calculated ($x^2 = k \cdot f_o$; where x is the counter sum of counter units 3a, 3b, which must be reached before the switches 7, 8 switchover).

In the positions of the switches 7 and 8 illustrated in FIG. 1, the motor is under the momentary control of the control frequency $f_n$ outputted from the frequency converter 1b. In this position, moreover, the calculator unit 3b is effective. From FIG. 2 the step function with which the control frequency $f_n$ of the motor is changed, will be apparent. The latter frequency is applied only for one period of the second sweep of frequency $f_o$ for a period count $x = 10$ (in FIG. 2, the second period row), for two periods of the third sweep (in FIG. 2, the third period row), for three periods of the fourth sweep (in FIG. 2, the fourth period row), etc., the first period row showing only periods of the original control frequency $f_o$.

For example, during the second sweep the number M registered in calculator 3b may be $M = 2$ so that after the first change from $M = 2$ to $M = 1$ in the calculator unit 3b the value therein is $1 - M = 0$. This can trigger a pulse from the counter which switches over the states of the switches 7 and 8.

In this new switch position of the switches 7 and 8, the motor is controlled with the frequency $f_o$ from frequency converter 1a. During this interval in each sweep the calculator unit 3a is effective and remains effective for the remaining 9 periods of the period count $x = 10$ so that the motor, having been controlled for one period at $f_n$ is then controlled for 9 periods at $f_o$. The calculator 3a can downcount by $-1$ for each of the periods N at which the motor is controlled by frequency $f_o$ until, after 9 periods, the calculator unit arrives at $1 - N = 0$. A pulse is then transmitted from counter 9 to again switchover the states of the switches 7 and 8. The motor is then controlled for two periods of the next sweep at the frequency $f_n$ and eight periods at the frequency $f_o$.

FIG. 2 shows a frequency change for 3 control frequency increments $\Delta f$ which is achieved by submultiple division of the frequency standard and a change in the divisor by 1 in each case.

In all three cases the change in the control frquency $\Delta f$ is completed after 100 periods have passed whereby;

$$x = n_{fn} + n_{fo} = 10.$$

If one starts with a frequency standard of 9 MHz as described, for the required control frequency $f_{st}$ of 1200 Hz, a divisor of 7500 is required. If this divisor is varied by 1, the control frequency change $\Delta f$ will be about 0.16 Hz.

According to the invention, however, this control frequency change is spread over the 10 periods of each period group and the 10 period groups so that the control frequency is adjusted in steps with 10 times more precision than could be obtained with a jump of $\Delta f$.

In earlier techniques such high precision could be obtained only by a 10-fold increase in the standard frequency with the drawbacks enumerated above.

By altering the factor k, in accordance with the invention, it is possible to change the period count within which the change in control frequency Δf is competed to suit the technological requirements of the system. Of course, with a change in the proportionality factor k, there is also a change in the time within which the control frequency change will be completed. In practice this permits an inversely proportional adjustment of the rotary field frequency to the required speed of the synchronous motor.

The applications of the system of the invention are not limited to the control of synchronous motors.

The method and apparatus can be used with advantage wherever large jumps in a control frequency is disadvantageous or where perfect linearity in a response is required.

Of course, instead of a linear response, the control frequency change can be nonlinear, if desired. It is, therefore, possible to increase the number of $n_{fn}$ periods with the new frequency from period group to period group by increments other than unity or in a nonlinear manner.

The number $n_{fn}$ of period groups can be varied advantageously in many cases in the succession 1, 3, 6, 10 in successive period groups. The control frequency change Δf is then completed after only four period groups $x_1$ to $x_4$.

The circuit shown in FIG. 1 can be used to generate intermediate frequencies over long time intervals. For example, it is possible to set the calculator units so that they will not affect changes in the numbers of the frequency packets $f_o$ and $f_n$ in each period group for long periods of time and thus so that the values $n_{fo}$ and $n_{fn}$ will remain constant. The intermediate frequency at the frequency output thus has the mean control frequency value $$f_{st} = 1/x(n_{fo} \cdot f_o + n_{fn} \cdot f_n)$$

For example, for a frequency standard $f_q = 9$ MHz, if it is required instead of a control frequency of 6000 Hz to have a control frequency of 5998.8 Hz, the divisor of the frequency converter 1a can be selected at 1500 Hz, the divisor of the frequency converter 1b at 1501 and the frequency converters 1a and 1b so switched that the frequency output within 10 periods will contain 7 periods ($n_{fo} = 7$) with the control frequency $f_o = 6000$ Hz and 3 periods ($n_{fn} = 3$) with a control frequency $f_n = 5996$ Hz. In this case, an intermediate frequency of:

$$f_{st} = 1/10 \; (7 \cdot 6000 + 3 \cdot 5996) = 5998.8 \text{ Hz}$$

is obtained as the desired frequency.

I claim:

1. A method of digital setting of a control frequency $f_{st}$, comprising the steps of:
   (a) dividing a standard frequency by an integer to form a first control frequency fo as a first submultiple of said standard frequency;
   (b) dividing said standard frequency by another integer to form a second control frequency fn as a second submultiple of said standard frequency;
   (c) mixing said first control frequency fo and said second control frequency fn so that within each period group $x_o$ of x periods of a resulting mixed signal constituting an output control frequency $f_{st}$ a fraction of the periods $n_{fo}$ is driven by the control frequency fo while a remaining fraction $n_{fn}$ of the periods is driven with the control frequency fn so that in each period group $x_o$ for the x periods;

$$x = n_{fn} + n_{fo};$$

inducing a change in the control frequency within a period count of $x^2$;
   dividing the $x^2$ periods into period groups $x_1$ to $x_x$ each of x periods so that the period groups $x_1$ to $x_x$ follow one another in succession; and
   increasing the fraction of the periods $n_{fn}$ by at least one period and decreasing the fraction of the periods $n_{fo}$ by at least one period from period group to period group in said succession of $x_1$ to $x_x$ period groups so that after the lapse of $x^2$ periods, all periods have the frequency fn.

2. The method defined in claim 1 wherein the period count $x^2$ is selected as a function of the desired control frequency $f_{st}$.

3. The method defined in claim 2 wherein the period count $x^2$ is selected so that:

$$x^2 = k \cdot f_{st}^3$$

wherein k is a proportionality constant.

4. The method defined in claim 1, further comprising the step of:
   generating said standard frequency by exciting a quartz crystal controlled oscillator.

5. An apparatus for digitally generating a control frequency $f_{st}$, comprising:
   a quartz crystal controlled oscillator for generating a standard frequency;
   first divider means connected to said oscillator for dividing said standard frequency by an integer to form a first control frequency fo as a first submultiple of said standard frequency;
   second divider means connected to said oscillator for dividing said standard frequency by another integer to form a second control frequency fn as a second submultiple of said standard frequency;
   frequency converter means connected to said divider means for mixing said first control frequency fo and said second control frequency fn so that within each period group $x_o$ of x periods of a resulting mixed signal constituting an output control frequency $f_{st}$ a fraction of the periods $n_{fo}$ is driven by the control frequency fo while a remaining fraction $n_{fn}$ of the periods is driven with the control frequency fn so that in each period group $x_o$ for the x periods:

$$x = n_{fn} + n_{fo}$$

and means for inducing a change in the control frequency within a period count of $x^2$, dividing the $x^2$ periods into period groups $x_1$ to $x_x$ each of x periods so that the period groups $x_1$ to $x_x$ follow one another in succession, and increasing the fraction of the periods $n_{fn}$ by at least one period and decreasing the fraction of the periods $n_{fo}$ by at least one period from period group to period group in said succession of $x_1$ to $x_x$ period groups so that after the lapse of $x^2$ periods, all periods have the frequency fn.

* * * * *